United States Patent
Yu et al.

(10) Patent No.: US 7,358,665 B2
(45) Date of Patent: Apr. 15, 2008

(54) ORGANIC ELECTRONIC DEVICE PROVIDED WITH A METALLIC HEAT SINK STRUCTURE

(75) Inventors: Gang Yu, Santa Barbara, CA (US); Jian Wang, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/999,821

(22) Filed: Nov. 30, 2004

(65) Prior Publication Data

US 2005/0098878 A1    May 12, 2005

Related U.S. Application Data

(60) Division of application No. 10/683,828, filed on Oct. 10, 2003, now Pat. No. 7,135,357, which is a continuation-in-part of application No. 10/680,268, filed on Oct. 6, 2003, now abandoned.

(51) Int. Cl.
*H05B 33/00* (2006.01)
*H01L 51/50* (2006.01)

(52) U.S. Cl. .................. 313/512; 313/503; 313/44; 313/46

(58) Field of Classification Search ............ 313/511, 313/512, 503, 504
See application file for complete search history.

(56) References Cited

U.S. PATENT DOCUMENTS

| | | | |
|---|---|---|---|
| 5,168,348 A | 12/1992 | Chu et al. | |
| 5,371,404 A | 12/1994 | Juskey et al. | |
| 5,483,098 A | 1/1996 | Joiner, Jr. | |
| 5,825,087 A | 10/1998 | Iruvanti et al. | |
| 5,986,888 A | 11/1999 | Amaro et al. | |
| 6,049,167 A * | 4/2000 | Onitsuka et al. | ............ 313/512 |
| 6,160,346 A | 12/2000 | Vleggaar et al. | |
| 6,174,425 B1 | 1/2001 | Simpson et al. | |
| 2003/0001488 A1 | 1/2003 | Sundahl | |
| 2004/0135482 A1 * | 7/2004 | Thielemans et al. | ........ 313/495 |

FOREIGN PATENT DOCUMENTS

EP    0 842 592 B1    10/2001
JP    10224059 A    *    8/1998

(Continued)

OTHER PUBLICATIONS

Patent Abstracts of Japan, vol. 1998, No. 09, Jul. 31, 1998. Publ. No. JP 10 106746 A, Pioneer Electron Corp; Tohoku Pioneer KK, Apr. 24, 1998.

(Continued)

*Primary Examiner*—Mariceli Santiago
(74) *Attorney, Agent, or Firm*—John H. Lamming

(57) ABSTRACT

An aspect of the present invention provides an organic electronic device includes a heat sink having a side with a roughened surface and/or a black surface and a process for forming devices having such heat sinks including forming a patterned electrically conductive layer includes an electrically conductive member. The process includes selectively forming spaced-apart members. The heat sink includes the spaced-apart members, which are spaced apart from each other and thermally coupled to the electrically conductive member.

15 Claims, 5 Drawing Sheets

FOREIGN PATENT DOCUMENTS

| | | | |
|---|---|---|---|
| JP | 2003022891 A | * | 1/2003 |
| WO | WO 00/69000 A | | 11/2000 |
| WO | WO 01/19142 A1 | | 3/2001 |
| WO | WO 02/17390 A | | 2/2002 |

OTHER PUBLICATIONS

Patent Abstracts of Japan, vol. 2003, No. 3, May 5, 2003, Publ. No. JP 2002 343559 A, Rohm Co. Ltd., Nov. 29, 2002.

Patent Abstracts of Japan, vol. 2003, No. 5, May 12, 2003, Publ. No. JP 2003 022891 A, Toshiba Corp., Jan. 24, 2003.

Patent Abstracts of Japan, vol. 2000, No. 12, Jan. 3, 2001, Publ. No. JP 2000 268980 A, Toyota Central Res & Dev Lab Inc., Sep. 29, 2000.

International Search Report, International Appln. No. PCT/US2004/033003, International Filing Date, Oct. 6, 2004, Dupont Co.

JP 2001052863, Patent Abstract, Organic EL Element and Manufacture Thereof, Feb. 23, 2001.

JP 2002117972, Patent Abstract, Organic EL Display Device and Its Manufacturing Method, Apr. 19, 2002.

* cited by examiner

ORGANIC ELECTRONIC DEVICE PROVIDED WITH A METALLIC HEAT SINK STRUCTURE

This application is a division of application Ser. No. 10/683,828, filed Oct. 10, 2003, now U.S. Pat. No. 7,135,357 which is a continuation-in-part of the parent application Ser. No. 10/680,268 filed Oct. 6, 2003, now abandoned.

FIELD OF THE INVENTION

The invention relates in general to organic electronic devices and processes, and more particularly to organic electronic devices including organic materials having sensitivity to heat and processes for forming and methods of using those devices.

BACKGROUND INFORMATION

Organic electronic devices have attracted considerable attention since early 1990's. Examples of organic electronic device include Organic Light-Emitting Diodes (OLEDs), which include Polymer Light-Emitting Diodes (PLEDs) and Small Molecule Light-Emitting Diodes (SMOLEDs). Due to the sensitivity of the organic materials used in organic electronic devices, such as charge transport layers, electroluminescent material, and the cathode to moisture and oxygen, organic electronic devices typically have rigorous package requirements for practical applications. Two types of packaging structures adopted for organic electron devices include (1) a sealing can with air gap and solid-state desiccants or epoxy with glass cover sheets and (2) a thick metal solder layer directly attached to a common cathode.

In active matrix ("AM") driven devices, the common electrode layer can be subjected to high current density when the display size is large or when the emission intensity increases above certain levels. In such cases, if the heat flowing from the light emitting junction area to the ambient air is insufficient, a significant temperature rise will take place in the device. The operation lifetime of OLEDs is strongly dependent on operation temperatures. For poly(phenylenevinylene) (PPV) derivatives with yellow or orange colors, the operation lifetime can be approximately 35 times shorter at 80° C. than at 25° C. (following a thermally activated form of:

$$\tau_{1/2}^{(T)} = \tau_{1/2}^{(T_0)} * e^{(-T/T_0)}$$

wherein $\tau_{1/2}^{(T)}$ and $\tau_{1/2}^{(T_0)}$ are half lives of an organic active material at temperatures of T and $T_0$, respectively). This implies that the operation lifetime can be reduced by approximately a factor of two for each 5° C. increase in temperature near room temperature.

The EL efficiencies of OLED pixels are typically in range of approximately 1-20 cd/A. For a full-color display with 50% aperture ratio and with a circular polarizer with approximately 40% optical transmission, the pixel current density is in range of approximately 30-600 mA/cm² for an emission intensity of approximately 400 cd/m². At an operation voltage of approximately 5 V, the corresponding input electric power density is in range of 0.15-3.0 W/cm².

FIG. 1 includes an illustration of a conventional OLED including a common cathode 166 that is covered by an epoxy layer 182 and glass sheet 184. FIG. 2 includes an illustration of another conventional OLED that is covered by a metal cap 284 having a desiccant 286. The metal cap 284 is attached using an adhesive 282. The OLEDs and their formation are described in more detail later in this specification (Control Examples within the Examples section). The OLEDs in FIGS. 1 and 2 may have thermal resistance coefficients (defined later in the specification) that are typically greater than 150° C.·cm²/W. The corresponding temperature rise of the emission pixels could be higher than 10° C. when operating at 200 cd/m² for a display having an area of approximately 3-6 cm².

For some outdoor display applications, an intensity of 500-2000 cd/m² is used. Organic electronic devices that can be used for lighting panels may have an emission intensity of 2000-5000 cd/m² in order to replace conventional fluorescent lights. AM-driven OLED displays and lighting panels with encapsulation schemes, such as the ones shown in FIGS. 1 and 2, may not be stably operated at such high brightness levels, and the device temperature may not even be stabilized due to insufficient heat flow out of the device (a phenomenon known as thermal run-off).

In another conventional PLED, a cathode may be formed over an EL layer and anode. An electrically conductive silver or nickel bonding layer having a thickness of approximately 400 nm may be formed over the cathode. An alloy foil having a thickness of approximately 200 microns is attached to the PLED by heating to melt the alloy. The foil is principally used as a substitute package to replace the packaging structures shown in FIGS. 1 and 2. The foil has a relatively low ratio of outer surface area to volume due to its substantially flat exposed upper surface (farthest from the EL layer). A thicker electrode, by itself, may not be a complete solution.

Heat dissipation issues are not unique to organic electronic devices. Inorganic (e.g., silicon-based) integrated circuits "(ICs)" can generate significant amounts of heat. Most notable are microprocessors (e.g., Intel Pentium™, AMD Athlon™, IBM PowerPC™ processors) due to their power requirements. Heat sinks can be used with inorganic ICs and typically have lengths and widths in a range of 60-100 mm and heights in a range of 30-60 mm. The ratio of the area (length times width) occupied by the inorganic IC heat sink divided by its height is in a range of 60-330. Fans may be used with the inorganic IC heat sinks. Many microprocessors have power densities of 400 W/cm² and higher. However, many of the heat sinks used for inorganic ICs cannot be used with organic electronic devices due to materials incompatibility issues (particularly with organic layer(s)), processing issues (organic electronic devices cannot withstand higher temperature processing used with inorganic electronic devices), thickness constraints, combinations thereof, or potentially other issues.

SUMMARY OF THE INVENTION

An aspect of the present invention provides an organic electronic device includes a heat sink having a side with a roughened surface.

In another embodiment, an organic electronic device includes an array of organic electronic components. The organic electronic device has a black surface.

In a different aspect of the present invention, a process for forming of an organic electronic device includes forming a patterned electrically conductive layer over a substrate. The patterned electrically conductive layer includes an electrically conductive member. The process also includes selectively forming spaced-apart members. The heat sink includes the spaced-apart members, which are spaced apart from each other and thermally coupled to the electrically conductive member.

In another embodiment, a process for forming an organic electronic device includes forming a layer over a substrate and forming a patterned resist layer over the layer. An exposed portion of the layer underlies an opening within the patterned resist layer. The method also includes etching at least partially through the exposed portion of the layer. A heat sink includes the layer.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
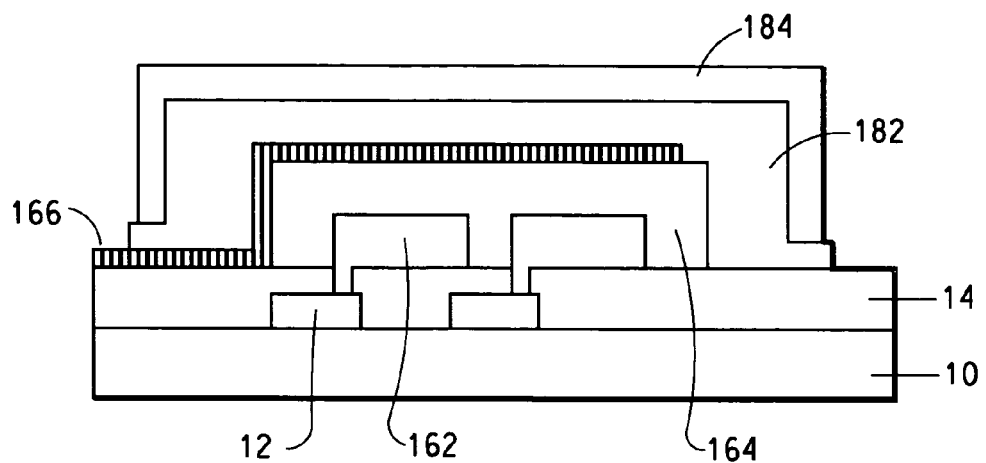
FIG. 1 is a cross-sectional view of an organic electronic device that is encapsulated by an epoxy layer and a glass sheet. (Prior art)

Skilled artisans appreciate that features in the figures are illustrated for simplicity and clarity and have not necessarily been drawn to scale. For example, the dimensions of some of the features in the figures may be exaggerated relative to other features to help to improve understanding of embodiments of the invention.

DETAILED DESCRIPTION

An aspect of the present invention provides an organic electronic device includes a heat sink having a side with a roughened surface or a black surface.

In a different aspect of the present invention, a process for forming of an organic electronic device includes forming a patterned electrically conductive layer over a substrate. The patterned electrically conductive layer includes an electrically conductive member. The process also includes selectively forming spaced-apart members. The heat sink includes the spaced-apart members, which are spaced apart from each other and thermally coupled to the electrically conductive member.

In another embodiment, a process for forming an organic electronic device includes forming a layer over a substrate and forming a patterned resist layer over the layer. An exposed portion of the layer underlies an opening within the patterned resist layer. The method also includes etching at least partially through the exposed portion of the layer. A heat sink includes the layer.

The detailed description first addresses Definitions and Clarification of Terms followed by the Thermal Resistance and Heat Dissipation, Structures, Materials, and Configurations, Fabrication Processes Through Organic Layer Formation, Electrode and Heat Sink Fabrication, Operating Finished Organic Electronic Devices, Advantages, and finally Examples.

1. Definitions and Clarification of Terms

Before addressing details of embodiments described below, some terms are defined or clarified. As used herein, the term "active" when referring to a layer or material is intended to mean a layer or material that has electronic or electro-radiative properties. An active layer material may emit radiation or exhibit a change in concentration of electron-hole pairs when receiving radiation.

The terms "array," "peripheral circuitry," and "remote circuitry" are intended to mean different areas or components of an electronic device. For example, an array may include a number of pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "black" when referring to a layer or a material is intended to mean a layer or material that absorbs significant radiation within the visible light spectrum (400-700 nm) and within the infrared ("IR") spectrum (near-IR spectrum (greater than 700 nm and less than 2.5 µm), middle IR spectrum (2.5-25 µm), far IR (greater than 25 µm), or any combination thereof).

The terms "electrical conductor" and its variants are intended to mean a layer material, member, or structure having an electrical property such that current flows through such layer material, member, or structure without a substantial drop in potential.

The terms "electrical insulator" and its variants are intended to mean a material, layer, member, or structure having an electrical property such that it substantially prevents any significant current from flowing through such material, layer, member, or structure.

The term "heat sink" is intended to mean a layer, member, or structure that has a principal purpose of dissipating or otherwise transferring heat. Note that a structure may serve more than one principal purpose. For example, an integrated electrode/heat sink can be a structure that is an electrode within an electronic device while still serving a significant heat dissipation or heat transfer function. Therefore, an integrated electrode/heat sink is a specific type of heat sink.

The term "high power density" is relative to the type of device. For a device having an active matrix display, high power density is intended to mean a power density of at least approximately 50 mW/cm$^2$. For a device having a passive matrix display, high power density is intended to mean a power density of at least approximately 20 mW/cm$^2$. For a device having a lighting panel, high power density is intended to mean a power density of at least approximately 2 W/cm$^2$.

The term "islands" is intended to mean members of a patterned layer, wherein the patterning extends through the entire thickness of the layer, and the members are space-apart from each other. Compare with mesas below.

The term "low thermal resistance coefficient" is intended to mean a thermal resistance coefficient (explained later in the specification) of no greater than 100° C.·cm²/W.

The term "mesas" is intended to mean features of a patterned layer, wherein the patterning extends only partially, but not completely, through the thickness of the layer, and the features are space-apart from each other. Compare with islands above.

The term "natural convection" is intended to mean convention caused by a temperature differential. Compare with forced convection that may occur when using a fan.

The term "organic electronic device" is intended to mean a device including one or more organic semiconductor layers or materials. Organic electronic devices include: (1) devices that convert electrical energy into radiation (e.g., a light-emitting diode, light-emitting diode display, diode laser, or lighting panel), (2) devices that detect signals through electronics processes (e.g., photodetectors (e.g., photoconductive cells, photoresistors, photoswitches, phototransistors, phototubes), IR detectors), (3) devices that convert radiation into electrical energy (e.g., a photovoltaic device or solar cell), and (4) devices that include one or more electronic components that include one or more organic semiconductor layers (e.g., a transistor or diode).

The term "outdoors" is intended to mean a location where ambient light varies significantly with the intensity of sunlight or a lack thereof. Note that in addition to being outside of a building, outdoors may also include the interior of a domed stadium having transparent or translucent panels within the dome, as the ambient light level within such domed stadium will vary significantly with the weather, time of day, or both.

The term "primary surface" refers to a surface of a substrate from which electronic components are fabricated.

The term "roughened" is intended to mean that the root mean square roughness of a surface of a layer or a member is greater than the root mean square roughness of a substantially flat surface of the same material(s) of the layer or member. A roughened surface may or may not have an irregular pattern.

The term "thermal coupled" is intended to mean at least two of any layers, materials, members or structures have contact each other or, if there are any intervening layer(s) material(s), member(s) or structure(s), all of such intervening layer(s), material(s), member(s) or structure(s) have low thermal resistance coefficient(s).

The term "thickness," when referring to a heat sink, is intended to mean thickness of the base portion, if any, and mesas, islands, or other features along a side of the heat sink.

As used herein, the terms "comprises," "comprising," "includes," "including," "has," "having" or any other variation thereof, are intended to cover a non-exclusive inclusion. For example, a process, process, article, or apparatus that comprises a list of features is not necessarily limited only those features but may include other features not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductor arts.

2. Thermal Resistance and Heat Dissipation

Thermal resistance is a measure that can be used to determine how well or poor heat dissipation can occur when using a specific layer or structure. Heat can be dissipated by conduction, convection, radiation, or any combination thereof. Conductive thermal resistance and convective surface thermal resistance are addressed below.

The conductive thermal resistance can be defined as:

$$R_{TQ} = \frac{1}{k_T} \frac{L}{A} \qquad \text{(Equation 1)}$$

wherein $k_T$ is the thermal conductivity for the specific material(s) in the layer or structures, L is the length along the direction of the heat flow, and A the area of the cross section normal to the heat flow. In one embodiment, L corresponds to a thickness of a layer or structure, and A corresponds to the footprint of the layer or structure.

The heat generated inside the device can be ultimately dissipated into the ambient air through the convection. The convective surface thermal resistance could be defined as:

$$R_{CQ} = \frac{1}{h_C A_S} \qquad \text{(Equation 2)}$$

wherein $h_C$ is the convection heat transfer coefficient, and $A_S$ is the surface area of the exposed surface. Even in the absence of any external cooling fluids (e.g., forced convection), some natural convection may occur when the surface of the heat sink is different from the ambient air temperature.

The temperature rise can depend on both the thermal resistance and the generated heat, as illustrated in the following equation:

$$\Delta T = R_Q \times Q \qquad \text{(Equation 3)}$$

wherein ΔT is the temperature difference between the device and the ambient air, $R_Q$ is the total thermal resistance including the conductive thermal resistance and the convective surface thermal resistance, and Q is the heat generated. In the case of a display including organic radiation-emitting components, $$\Delta T = T_j - T_{air} \quad \text{(Equation 4)}$$

wherein $T_j$ is the junction temperature of the organic radiation-emitting component, and $T_{air}$ is the temperature of the ambient air. $T_{air}$ may be measured at a distance in a range of approximately 1-9 cm away from a display after the display has been off for at least 15 minutes.

Equation (1) and (2) depend on area. Therefore, as the display size gets larger, the thermal resistance becomes smaller; however, the power required for the panel increases. Therefore, a more practical equation can use power per unit area to allow for scaling of different size displays. Accordingly, a thermal resistance coefficient can be used as illustrated the following equation.

$$T_j - T_{air} = \left(\frac{L}{k_T} + \frac{1}{h_C}\right) \times \frac{Q}{A} \quad \text{(Equation 5)}$$

Put in simple terms, the thermal resistance coefficient is the portion of Equation 5 within the parenthesis and is essentially the thermal resistance in Equations 1 and 2 without the area ("A") variable.

3. Structures, Materials, and Configurations

Organic electronic devices can generate significant amounts of heat during operation. By improving the heat dissipation of the organic electronic device, the organic electronic device can operate under a wide variety of operating conditions without more than a 10° C. rise in temperature compared to the ambient temperature. The temperature can be measured at an external surface of the organic electronic device. For example, the temperature may be measured at the user side of a substrate from which a display has been fabricated. An IR measuring instrument can measure the temperature of a display or lighting panel. The IR measuring instrument may include one or more filters so that visible light from a display or a lighting panel does not significantly interfere with the temperature measurements. Alternatively, no visible light filter may be used with the IR measuring instrument. A first temperature of the substrate along the user side (the side in contact with the air) of the organic electronic device can be measured after the device has been operating for at least a minute. A second temperature of the substrate along the user side is measured after the device has been turned off (not emitting radiation or light) for at least 15 minutes. The difference between the first and second temperatures may be no more than 10° C.

The mechanism for heat dissipation may be any one or more of thermal conduction, convection, and radiation. The different structures and configurations described herein can be used to improve any or all heat dissipation mechanisms. Black surface(s) can be used to improve thermal radiation. Increasing surface area can improve heat transfer regardless of heat dissipation mechanism. At least part of the structure may or may not be part of the package used to substantially prevent air, water, or other impurities from reaching organic layer(s) within the organic electronic device and to reduce the likelihood of damage during routine handling of the organic electronic device. The heat dissipation structures and configurations described herein may be used by nearly any organic electronic device. Such devices can include displays (active matrix ("AM") or passive matrix ("PM")), lighting panels, sensors and detectors, voltaic and other energy conversion devices, and any combination thereof. Organic electronic devices having high emission intensity, high power density requirements, or both may significantly benefit from the structure and configurations described herein. In one embodiment, an organic electronic device may include an AM display that is designed to be used outdoors and have an emission intensity of at least 500 cd/m². Such an organic electronic device may realize significantly improved reliability, lifetime, and image quality by using any one of the structures, configurations, or combination thereof as described herein.

Improved heat dissipation may be achieved by using a heat sink. The heat sink typically has a thickness no greater than 9 mm. Displays for cell phones, personal digital assistants, digital cameras, etc. may have thickness limitations, and therefore, the heat sink may have a thickness no greater than 500 microns. In one embodiment, the thickness is no greater than 90 microns and may be in a range of approximately 5-25 microns for very thin applications.

The area occupied by the heat sink (the heat sink's footprint) may depend in part on the electronic device in which it will be used. For example, the heat sink may have a footprint substantially the same as the substrate used in forming organic electronic components. Alternatively, the heat sink may have a footprint that substantially corresponds to an array of organic electronic components. In still other embodiments, the heat sink may have a footprint larger than the substrate, smaller than the array, or an intermediate value, such as larger than the array but smaller than the substrate. The ratio of the area (footprint) to thickness for the heat sink, when expressed in mm² and mm, respectively, is at least 500:1. In an alternative embodiment, the ratio is at least 1100:1. For thin applications (e.g., cell phones, personal digital assistants, digital cameras, etc.) the ratio may be at least 11,000:1 or even higher.

The heat sink has a side furthest from the organic layer used within the organic electronic device. That side may or may not be patterned. If patterned, many different patterns may be used. Regardless of the pattern chosen, the top portion has additional exposed surface area to help increase heat dissipation from the device. Therefore, the exposed surface area due to the pattern is significantly larger than the footprint of the heat sink.

In one embodiment, the pattern may define features in the shape of fins, pins, or a combination thereof. From a plan view of the heat sink, the fins may extend in rows, columns, diagonals, or any combination thereof. From a plan view of the heat sink, the features may be nearly any shape including circles, squares, rectangles, diamonds, triangles, pentagons, hexagons, etc. The lengths of sides for any of polygons may be the same or different compared to one another. Alternatively, a serpentine pattern could be used. In still another embodiment an irregular pattern, such as one that may be present with a roughened surface, may be used.

The pattern can extend at least partially though the thickness of the heat sink. The pattern may be in the form of mesas, islands, or a combination thereof. The pattern significantly increases the surface area along the side of the heat sink opposite the organic layer.

The heat sink typically has good thermal conductivity and may be an electrical conductor or an electrical insulator. The heat sink may comprise one or more layers. The one or more layers can include a metal, a metal alloy, a metal oxide, a metal nitride, a ceramic material, an organic material, and combinations thereof. The metals and metal alloys may be selected from the group consisting of Al, Ag, Ni, Cr, Cu, Pt, In, Sn, Bi, Pb, Hg, Ga, Cd, their alloys, and any combination thereof. Metal oxides and metal nitrides may be selected from the group consisting of $Al_2O_3$, $SiO_2$, TiN, TaN, WN, $Si_3N_4$, and any combination thereof. Laminates and prepregs used in the electronics industry (for circuit boards, circuitized substrates for integrated circuits, and combinations thereof) may be used as thermally conductive organic materials for the heat sink. Exemplary organic materials include a woven fiberglass fabric saturated with an epoxy resin material (e.g., FR4, RO4003C, RO4350B, FR4/RO4000, etc.) or woven fiberglass fabric within polytetrafluoroethylene. Additional exemplary organic materials include polyaromatic amide (Kevlar® resin), heat-conductive rubbers as described in U.S. Pat. No. 6,211,276 (Miyahara), FR5, polyimide, epoxy and polyphenylene oxide resins (e.g. GETEK™ resins), graphite, thermally conductive acrylonitrile butadiene styrene ("ABS"), thermally conductive liquid crystalline polymer ("LCP"), thermally conductive polyamide 4,6 (PA 4,6), thermally conductive polyphenylene sulfide, thermally conductive thermoplastic elastomer, thermally conductive thermoplastic silicone vulcanite, and combinations thereof. Another type of organic heat sink could be formed using base plastic material with metal particles molded within the plastic. The metal particles may or may not contact one another. The base organic material could be polypropylene, acrylic, polyvinylchloride, polystyrene, ABS, thermoplastic polyurethane, polyamide including aromatic polyamide, polyethylene terephthalate, polyphenylene oxide, polycarbonate, polycarbonate/ABS, syndiotactic polystyrene, polyphenylene sulfide, LCP, polysulfone, polyetheretherketone, polyetherimide, polyamideimide, thermoplastic polyimide, thermoplastic fluropolymer, thermoplastic elastomer, and combinations thereof.

In one embodiment, the heat sink may comprise a low melting point metal or metal alloy. The metal or metal alloy may comprise In, Sn, Bi, Pb, Hg, Ga, Cd, any alloy of such metals, or any combination thereof. The metal or metal alloy may have a melting point greater than 85° C. because the organic electronic device may be subjected to tests as high as 85° C. The metal or metal alloy may have a melting point less than 240° C. to reduce the likelihood of damage to an organic layer within the organic electronic device. A melting point in a range of 130° C. to 150° C. may be used in one embodiment. In such an embodiment, alloys of In, Sn, and Pb may have eutectic temperatures in the range of 130-150° C.

In one embodiment, an integrated electrode/heat sink may be used. In this embodiment, a single structure serves principal functions of flowing current to or from an organic electronic component and heat dissipation. The integrated electrode/heat sink is a specific type of heat sink.

In another embodiment, an electrode and a heat sink may be separate structures that can be joined using an intermediate layer between the electrode and a heat sink. The intermediate layer may comprise a relatively low melting point metal or metal alloy or may comprise a bonding layer.

If the intermediate layer comprises a low melting point metal or metal alloy, such low metal point metal or metal alloy may comprise any of the materials previously recited. The low melting point metal or metal alloy may be part of or attached to the electrode or heat sink. The electrode and heat sink are placed near each other with the low melting point metal or metal alloy between them. The melting operation previously described can be used. Alternatively, the low melting point metal or metal alloy and heat sink may be separate and not attached to the electrode. The low melting point metal or metal alloy and the heat sink may be placed over the electrode, and the previously described melting operation may be used.

If the intermediate layer comprises a bonding layer, the bonding layer may or may not be electrically conductive. The bonding layer may include an epoxy or an organic silicone. The bonding layer may be applied to an electrode or other portion of the substrate, the heat sink, or both.

The bonding layer may be electrically conductive when it comprises at least 17 volume percent of a metal or a metal alloy including Al, Ag, Ni, Cr, Cu, Pt, In, Sn, Bi, Pb, Hg, Ga, Cd, an alloy thereof, or any combination thereof. Note that even when the bonding layer includes at least 17 volume percent of a metal or metal alloy, the bonding layer may or may not be electrically conductive when applied to a surface. In one embodiment, a metal-containing bonding layer may not be electrically conductive when applied over a substrate or to a surface of the heat sink but may become conductive after the bonding layer is cured.

If the bonding layer is an electrical insulator, it may or may not contain a metal or a metal alloy. If the bonding layer includes a metal or metal alloy, the bonding layer may have less than 17 volume percent of the metal or metal alloy.

In still another embodiment, the intermediate layer may also comprise a thin electrical insulating layer comprising a ceramic material (quartz, silicon nitride, alumina, or the like). The electrical insulating layer can be used with a bonding layer.

The intermediate layer does not need to have low thermal resistivity but should have a low thermal resistance coefficient. The thermal resistance coefficient is a function of the thermal resistivity and heat transfer length (i.e., thickness of the layer). If a material has a high thermal resistivity, its thickness is kept relatively thin to achieve the low thermal resistance coefficient. Conversely, if a material has a low thermal resistivity, a wider range of thicknesses can be used and still achieve a low thermal resistance coefficient. An underlying layer or other structure is considered thermally coupled to the heat sink of such underlying layer or other structure contacts the heat sink or if any and all intervening layer(s) have low thermal resistance coefficient(s).

Radiational cooling may be improved by having at least one side of an array of organic electronic components within the organic electronic device with a black surface. The black surface is designed to absorb significant radiation within the visible and IR spectra. The black surface may have a layer that comprises carbon black. Alternatively, anodized aluminum has black surface and may be used.

The black surface may be formed by using commercially available black spray paint and coating it along an exposed surface of the organic electronic device. Note that the heat sink may or may not be present. If the heat sink is not present, the glass layer of FIG. 1 or the metal cap of FIG. 2 may be coated with black spray paint. If the heat sink is present, its exposed surface can be black. Just by having a black surface, the heat dissipation may be improved by 5-10% without any other changes being made.

The various configurations previously described are advantageous for an AM array or a lighting panel that may have higher power density requirements compared to a passive matrix ("PM") array. Displays may be designed to have power densities in a range of approximately 100-1000 $mW/cm^2$ when electrodes of the organic electronic device are biased during operation. Lighting panels may have power densities reaching 9 $W/cm^2$ and potentially higher. In other embodiments, the organic electronic devices have a power density in the range of 2 to 3 mW/cm$^2$. Still, a PM array or other organic electronic devices can benefit from improved heat dissipation.

Figure 3:
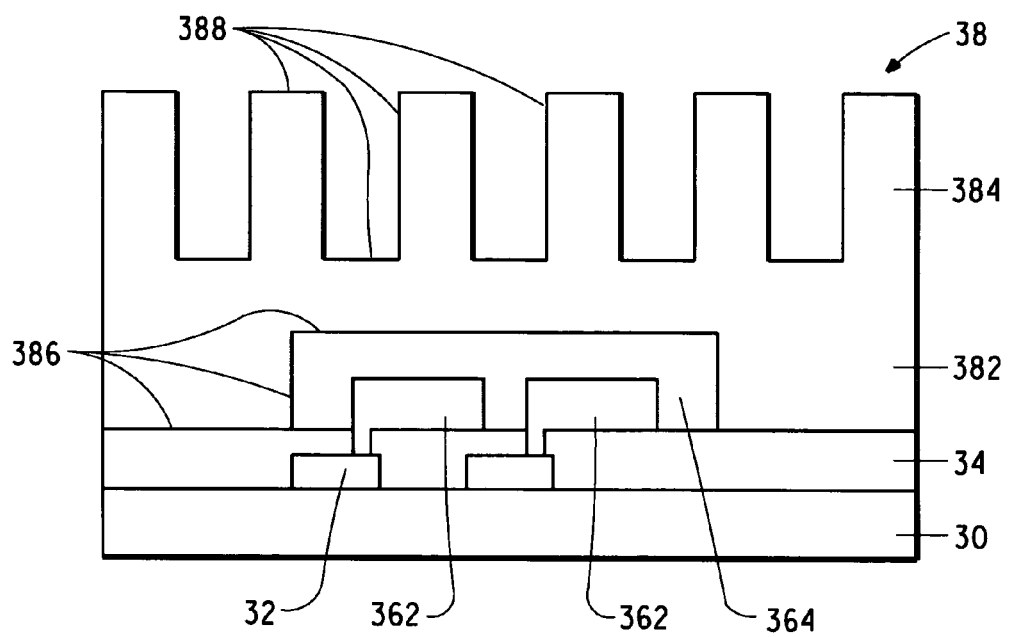
FIG. 3 is a cross-sectional view of an organic electronic device having a heat sink with a patterned exposed upper surface.

Attention is now directed to some exemplary, non-limiting configurations described with respect to FIGS. 3-6 and their variants. FIG. 3 includes an organic electronic device and features a heat sink 38 with a patterned exposed outer surface 388. The organic electronic device includes pixel driver circuits 32, which are used to drive an active matrix display, that overlie a substrate 30. A planarized dielectric layer 34 includes a pattern that defines contact openings extending to leads or other conductive wirings within the pixel driver circuits 32. First electrically conductive members 362 overlie the planarized dielectric layer 34 and extend through openings in layer 34 to the leads or other conductive wirings within the pixel driver circuits 32. An organic layer 364 overlies the first electrically conductive members 362 and adjacent portions of the planarized dielectric layer 34.

The heat sink 38 for the array of pixels can overlie the organic layer 364. In this embodiment, the heat sink 38 is an integrated electrode/heat sink, and therefore, has principle functions of carrying current for the organic electronic device and transferring heat. All of the layer(s) in the heat sink 38 (not individually shown in FIG. 3) may be electrically conductive and have low thermal resistivity. The heat sink 38 may be electrically connected to a ground potential in this embodiment because the heat sink 38 also functions as a common cathode.

The heat sink 38 has a patterned exposed outer surface. The heat sink 38 includes a base portion 382 and a mesa portion having mesas 384 shaped in the form of fins in this particular embodiment. The heat sink 38 has an inner side 386 (closest to organic layer 364) that contacts the planarized dielectric layer 34 and organic layer 364. The surface area along the inner side 386 is little larger but approximately the same as each of the footprint of the heat sink 38 and the pixel array area 72 (pixel array area 72 is addressed below with respect to FIG. 7). The surface area along the outer side 388 (farthest from organic layer 364) is significantly larger than the surface area along the inner side 386 due to the presence of the walls of the mesas 384. Air may flow between the mesas 384 due to natural convection can help to dissipate or otherwise transfer heat and allow the organic electronic device to operate at a lower temperature, thus, improving reliability and brightness over the lifetime of the device. The thickness of the heat sink 38, including the mesas 384, is usually at least approximately 5 microns. From a plan view, the mesa density can be in a range of approximately 1-100 mesas/mm$^2$. Similarly, the island density may be in a range of approximately 1-100 islands/mm$^2$.

Figure 4:
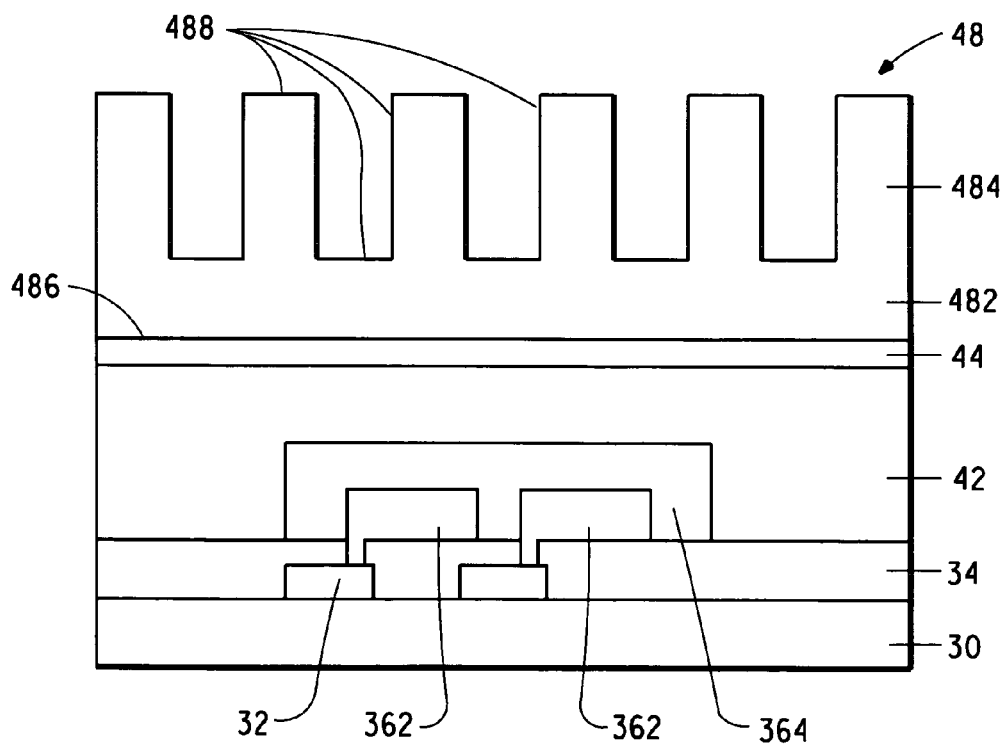
FIG. 4 is a cross-sectional view of an organic electronic device having a second electrically conductive member, a bonding layer, and a heat sink with a patterned exposed upper surface.

FIG. 4 includes an illustration of a cross-sectional view of an organic electronic device in accordance with another embodiment of the present invention. In this embodiment, a second electrically conductive member 42 is separated from a heat sink 48 by an intermediate layer 44. A thick or thin layer for the second electrically conductive member 42 overlies the organic layer 364. The second electrically conductive member 42 can be an electrode. In one embodiment, the second electrically conductive member 42 is a common cathode for the array and may be electrically connected to a ground potential. The second electrically conductive member 42 has a thickness no greater than approximately 1 micron. Note that a principal function of the second electrically conductive member 42 is for current conduction. Although the second electrically conductive member 42 may have a low thermal resistivity, its principal function is not that of a heat sink in this embodiment.

An intermediate layer 44 may lie between the heat sink 48 and the second electrically conductive member 42. The intermediate layer 44 has a low thermal resistivity coefficient to allow for good heat transfer to the heat sink 48. The second electrically conductive member 42 is thermally coupled to the heat sink 48 via the intermediate layer 44.

The intermediate layer 44 may include a bonding layer that includes epoxy, organic silicone, or a combination thereof. If the intermediate layer 44 is an electrical conductor, the intermediate layer 44 (e.g., epoxy) may include at least 17 volume percent a metal, such as Al, Ag, Ni, Cr, Cu, Pt, In, Sn, Bi, Pb, Hg, Ga, Cd, their alloys, or any combination thereof. As an alternative embodiment, metal-coated elastic, plastic shells may be substituted for the metal particles in the bonding layer. Alternatively, the intermediate layer 44 may be an electrical insulator. When the intermediate layer 44 is an electrical insulator, the epoxy, organic silicone, or combination of them can achieve a low thermal resistance coefficient if kept thin enough. The epoxy, organic silicone, or their combination may or may not include an electrically conductive, metallic material. If such material is present, its concentration should be kept lower than 17 volume percent if the intermediate layer 44 is an insulator.

In still another embodiment, the intermediate layer 44 may include "z-axis" conductors. An intermediate layer 44 with z-axis conductors can include an interposer used within the inorganic semiconductor industry. The interposer includes a flexible compressive layer of material with spring-shaped or other shaped metal conductors oriented through the thickness of the layer. When the intermediate layer 44 is compressed, the metal conductors within the interposer may contact the second conductive member 42 and the heat sink 48.

As illustrated in this embodiment, the heat sink 48 includes a base portion 482 and a mesa portion having mesas 484. Similar to the heat sink 38, the heat sink 48 has an inner side 486 and an outer side 488. The surface area along the inner side 486 is substantially the same as each of the footprint of the heat sink 48 and the pixel array area 72. The surface area along the outer side 488 is significantly larger than the surface area along the inner side 486. In an alternate embodiment (not shown) the base portion 482 may not be present and the mesas 484 may be replaced by islands (openings between the members extend to an underlying layer (e.g., bonding layer 44 or second electrically conductive member 42). The thickness of the heat sink 48, including the mesas or islands, is usually at least approximately 5 microns.

Figure 5:
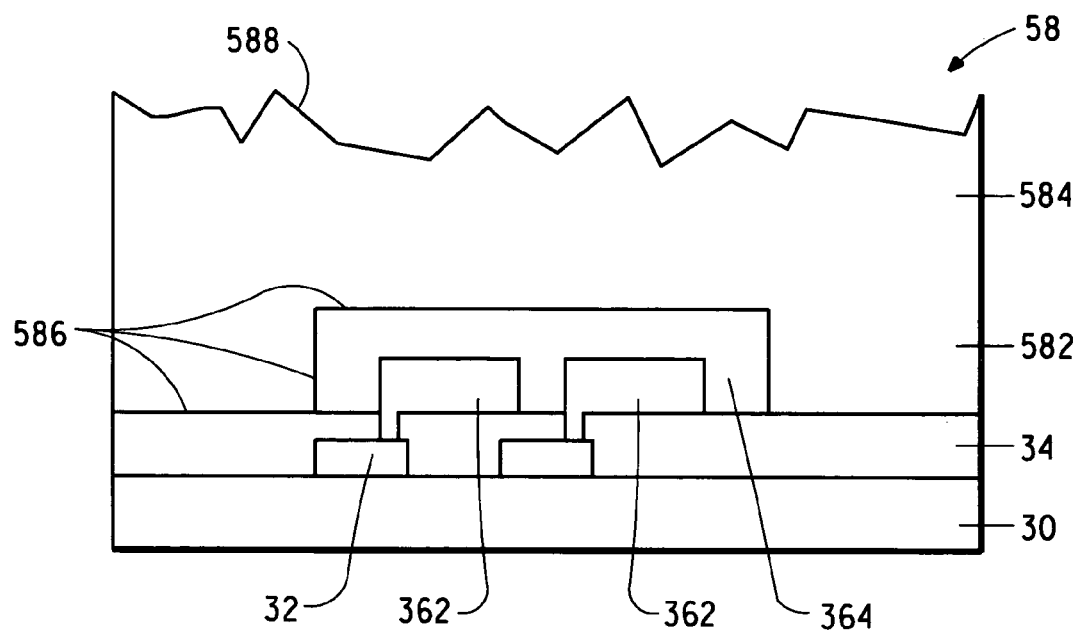
FIG. 5 is a cross-sectional view of an organic electronic device having a heat sink with a roughened exposed upper surface.

FIG. 5 includes an illustration of a cross-sectional view of an organic electronic device similar to the one shown in FIG. 3. Both have heat sinks with patterned outer surfaces. However, unlike heat sink 38, heat sink 58 in FIG. 5 has a roughened surface, which may or may not have an irregular pattern. The heat sink 58 has an inner side 586 and an outer side 588. The inner side 586 contacts the planarized dielectric layer 34 and organic layer 364. The surface area along the inner side 586 is little larger but approximately the same as each of the footprint of the heat sink 58 and the pixel array area 72. The surface area along the outer side 588 is significantly larger than the surface area along the inner side 586 due to the presence of the roughened surface.

The elevational differences (as measured from the primary surface of the substrate 30) between the peaks and valleys of the outer side 588 may be in a range of approximately 3-300 microns, approximately 20-80 percent of the thickness of the heat sink 58, or a combination thereof. In one embodiment, the thinnest portion of the heat sink 58 may be at least 25 microns to provide adequate mechanical support and reduce the likelihood of tearing the heat sink 58 when it is being handled or attached to the organic electronic device. The roughness of the surface at outer side 588 is at least an order of magnitude rougher than the root mean surface roughness of the same material when evaporated, sputtered, or otherwise deposited over a substantially flat surface.

Any of the heat sinks 38, 48, 58, their variants, and combinations of them may be used for nearly any electronic device. For example, inorganic semiconductor integrated circuits may use a heat sink as described. Compared to conventional heat sinks in the semiconductor arts, the heat sinks described herein are typically thinner and have a higher ratio of area:thickness.

Figure 6:
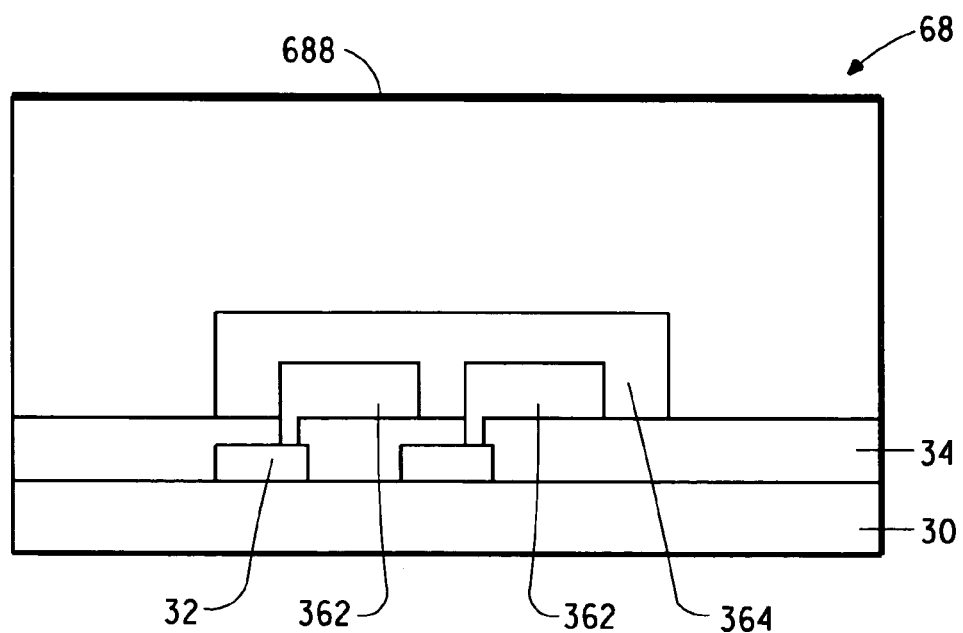
FIG. 6 is a cross-sectional view of an organic electronic device having a black outer surface.

FIG. 6 includes an illustration of a cross-sectional view of an organic electronic device similar to the one shown in FIG. 3. However, unlike heat sink 38, heat sink 68 has a black surface 688 and does not have a patterned outer surface. The black surface 688 improves heat dissipation by thermal radiation. In one embodiment, the black surface 688 may be one or more layers that include carbon black. Other materials with black surfaces (e.g., anodized aluminum) may be used.

The surface area along the black surface 688 is substantially the same as each of the footprint of the heat sink 68 and the pixel array area 72. The thickness of the heat sink 68 is usually at least approximately 5 microns. Although not shown, each of the heat sinks as described with respect to FIGS. 3-5 could also have one or more black surfaces. In one embodiment, surface 388, 488, 588, or any combination of them may have a black surface. In another embodiment, the outer surface(s) of the organic electronic devices in FIGS. 1 and 2 may have black surfaces.

4. Fabricating Processes Through Organic Layer Formation

Attention is now directed to details in forming the electronic devices. The process to fabricate the organic electronic device shown in FIG. 3 is initially described. Processes for forming the electronic devices shown in FIGS. 4, 5 and 6 are addressed subsequently as are other non-limiting alternatives and variants.

FIG. 3 includes a substrate 30 that can be flexible or rigid, organic or inorganic. Generally, glass or flexible organic films are used as a support. Pixel driver circuits 32 and other circuits may be formed over the substrate 10 using conventional techniques. The other circuits (not shown) outside the array may include peripheral and remote circuitry used to control the pixels within the array. The focus of fabrication is on the pixel array rather than the peripheral or remote circuitry. A planarized dielectric layer 34 may be formed over the pixel driver circuits 32. The dielectric layer 34 may comprise an electrically insulating oxide, nitride, polymer, or any combination thereof and may be formed using conventional techniques.

In one embodiment, the first electrically conductive members 362 are electrodes (e.g., anodes) that are more efficient for injecting holes compared to the subsequently formed integrated electrode/heat sink 38. The first electrically conductive members 362 may include one or more conductive layers. The surface of the first electrically conductive members 362 farthest from the substrate 30 includes a high work function material. The first electrically conductive members 362 include one or more layers of indium tin oxide, aluminum tin oxide, or other materials conventionally used for anodes within organic electronic devices. In this embodiment, the first electrically conductive members 362 transmit at least 70% of the radiation to be emitted from or received by subsequently formed organic active layer(s). In one embodiment, the thickness of the first electrically conductive members 362 is in a range of approximately 100-200 nm. If radiation does not need to be transmitted through the first electrically conductive members 362, the thickness may be greater, such as up to 1000 nm or even thicker.

The first electrically conductive members 362 may be formed using one or more of any number of different techniques including a conventional coating, casting, printing (ink jet printing, screen printing, etc.), vapor deposition, other deposition process, or any combination thereof. The first electrically conductive members 362 may be formed as a patterned layer (e.g., using a stencil mask) or by depositing the layer(s) over all the substrate 30 and using a conventional patterning technique.

Figure 7:
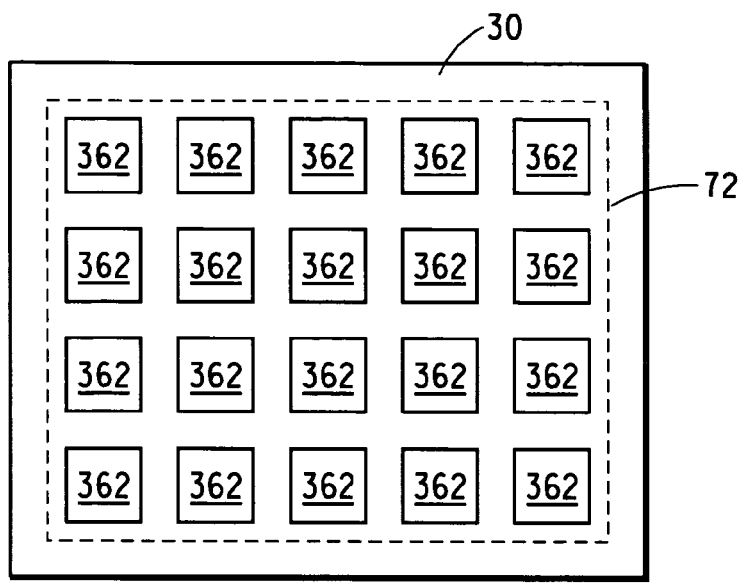
FIG. 7 is a plan view of a substrate after forming first electrically conductive members.

FIG. 7 includes an illustration of a plan view of the pixel array after the first electrically conductive members 362 have been formed. In an actual device, more or fewer first electrically conductive members 362 may be used. For simplicity, a relatively small array is illustrated. The first electrically conductive members 362 overlie a pixel array area 72 of the substrate 30. The pixel array area 72 substantially corresponds the outer perimeter of the set of first electrically conductive members 362.

Referring to FIG. 3, the organic layer 364 may be formed aver the planarized dielectric layer 34 and first conductive members 362. The organic layer 364 includes one or more layers. For example, the organic layer 364 may include one or more charge-transport layers and an organic active layer, or the organic active layer without any charge-transport layer. Charge-transport layer(s) may lie along one or both sides of the organic active layer. When the charge-transport layer lies between the first conductive members 362 and the organic active layer, the charge-transport layer will be a hole-transport layer, and when the charge-transport layer lies between the organic active layer and subsequently formed conductive members that act as second electrode(s) (i.e., cathodes), the charge-transport layer will be an electron-transport layer. in addition to facilitating transport of charge from the first conductive members 362 to the organic active layer, the charge-transport layer may also function as a charge injection layer facilitating injection of charged carriers into the organic active layer, a planarization layer over the first conductive members 362, a passivation or chemical barrier layer between the first conductive members 362 and the organic active layer, or any combination thereof.

The organic layer 364 can be formed by one or more of any number of different techniques including spin coating, casting, printing (ink jet printing, screen printing, etc.), vapor depositing, other deposition process, or any combination thereof of appropriate materials as described below. One or more of the layers within the organic layer 364 may be cured after each, all, or any combination of them are applied over the substrate 30.

If a charge-transport layer that acts as a hole-transport layer is present, it may include one or more of polyaniline ("PANI"), poly(3,4-ethylenedioxythiophene) ("PEDOT") or material(s) conventionally used as hole-transport layers as used in organic electronic devices. The hole-transport layer typically has a thickness in a range of approximately 100-250 nm.

The composition of the organic active layer typically depends upon the application of the organic electronic device. The organic active layer can include material(s) as conventionally used as organic active layers in organic electronic devices and can include one or more small molecule materials, one or more polymer materials, or any combination thereof. After reading this specification, skilled artisans will be capable of selecting appropriate material(s), layer(s) or both for the organic active layer. In one embodiment, the organic active layer has a thickness in a range of approximately 50-500 nm.

If a charge-transport layer that acts as an electron-transport layer is present, it may include one or more of aluminum tris(8-hydroxyquinoline) or other material conventionally used as electron-transport layers in organic electronic devices. The electron-transport layer typically has a thickness in a range of approximately 30-500 nm.

In an alternative embodiment, the organic layer 364 may include a single layer with a composition that varies with thickness. For example, the composition closest to the first conductive members 362 may act as a hole transporter, the next composition may act as an organic active layer, and the composition farthest from the first conductive members 362 may act as an electron transporter. One or more materials may be present throughout the entire thickness of the organic layer.

Portions of the organic layer 364, if any, that lie outside the array (see dashed line 72 in FIG. 7) may be removed. Typically, at least portions of conductive leads to peripheral circuitry, remote circuitry, or both may become exposed. Also, the "rail" (location where a subsequently formed lid is attached to the substrate 30) may be cleared of the organic layer 364.

5. Electrode and Heat Sink Fabrication

Many alternatives exist for forming a heat sink (by itself or in the form of an integrated electrode/heat sink) and potentially a separate second electrically conductive member that may act as an electrode. The organic electronic device including such a heat sink and potentially the second electrically conductive member has good heat dissipation characteristics. One or more layers can be used to form the heat sink and electrode, if separate from the heat sink.

Turning to FIG. 3, the heat sink 38 is an integrated electrode/heat sink. In one embodiment, an electrically conductive layer, which is closest to the organic layer 364, is particularly efficient for injecting electrons or negative charge carriers in the organic layer 364. The electrically conductive layer can include any metal or nonmetal having a lower work function than the first electrically conductive members 362. Materials for the electrically conductive layer can be selected from alkali metals of Group 1 (e.g., Li, Na, K, Rb, Cs,), the Group 2 (alkaline earth) metals, the Group 12 metals, the rare earths, the lanthanides (e.g., Ce, Sm, or Eu), and the actinides. Materials, such as Al, In, Ca, Ba, Y, and Mg, and combinations, may also be used. Specific non-limiting examples of materials for the electrically conductive layer include Ba, Li, Ce, Cs, Eu, Rb, Y, Mg, and Sm.

The electrically conductive layer can be formed by a vapor or other deposition process. In one embodiment, the second electrically conductive member layer may be deposited using a stencil mask to form the second electrically conductive member layer at desired location(s). For an AM-driven array, the electrically conductive layer may substantially correspond to and have edges that are substantially coterminous with the edges of the pixel array area 72 (in FIG. 7). The thickness of the second electrically conductive member layer is typically no greater than approximately 1 micron.

The heat sink 38 may include an optional middle portion that can comprise a metal or a metal alloy with good electrical conductivity and dense film morphology. The metals and metal alloys may be selected from the group consisting of Al, Ag, Ni, Cr, Cu, Pt, In, Sn, Bi, Pb, Hg, Ga, Cd, their alloys, and combinations thereof. In an alternative embodiment, the middle portion may not be used.

The composition of the top portion of the heat sink 38 can comprise a metal or metal alloy. The metal or metal alloy may comprise In, Sn, Bi, Pb, Hg, Ga, Cd, any alloy of such metals, or any combination thereof. The metal or metal alloy may have a melting point greater than 85° C. because the organic electronic device could be subjected to tests as high as 85° C. The metal or metal alloy may have a melting point less than 240° C. to reduce the likelihood of damage to the organic layer 364. A melting point in a range of 130° C. to 150° C. may be used in one embodiment. In such an embodiment, alloys of In, Sn, and Pb may have eutectic temperatures in the range of 130-150° C.

After reading this specification, skilled artisans will appreciate that the composition of the top portion can be selected to achieve a desired melting point, adhesion to underlying layers, thermal coefficient of expansion, or other physical properties. The top portion of the heat sink 38 may comprise an organic material with good thermal conductivity. The top portion (including the mesas 384) may have a thickness in a range of approximately 5-500 microns. Specific formation procedures are described below to provide some non-limiting examples to better illustration some of the formation options.

In one embodiment, the integrated electrode/heat sink 38 may be formed using two depositions with two different stencil masks using a physical vapor deposition technique, such as evaporation or sputtering. The base portion 382 may be formed using a stencil mask that generally corresponds to the pixel array. The mesas 384 may be formed using another stencil mask. This other stencil mask has openings so that the mesas 384 are only formed over the base portion 382 and no other part of the substrate 30, such as areas for peripheral or remote circuitry. As seen from a plan view, the mesas 384 overlie only part, but not all, of the base portion 382. The thickness of the integrated electrode/heat sink 38 may be in a range of approximately 5-25 microns.

In still another embodiment (not shown), etching may be used to form the mesas 384 overlying the base portion 382. A thick layer having low thermal resistivity may be formed to a thickness in a range approximately 5-25 microns. If the thick layer is to be attached to the organic electronic device, the thick layer may have thickness greater than 25 microns. A patterned resist layer (not shown) can be formed over the thick layer. Exposed portions of the thick layer underlie openings in the patterned resist layer. The exposed portions of the thick layer may be at least partially etched using wet or dry etching. If only part of the thickness of the thick layer is etched, mesas 384 are formed. The base portion 382 includes the part of the thick layer underlying the mesas 384 and openings between the mesas 384. Alternatively, if the entire thickness of the thick layer is etched, islands (not shown) are formed.

In still another embodiment, the mesas 384 may be formed by plating. After forming the base portion 382, a patterned electrical insulating layer (not shown) can be formed over the base portion 382 and other portions of the substrate 30. The patterned electrical insulating layer defines openings where the mesas 384 may be formed. No openings may be present outside the array.

A plating apparatus and method, such as the one described in U.S. Pat. No. 6,174,425 (Simpson), can be used to plate the mesa portions 384 over the base portion 382. The base portion 382 can be electrically connected to the cathode of the plating apparatus. An electrically conductive material for the mesas 384 is plated over the base portion 382 but is not significantly plated over the patterned electrical insulating layer. The electrically conductive material can include a metal, mixed metal, alloy, or a combination thereof. Exemplary metallic elements used in the conductive material may include Ni, Cu, Au, Ag Pt, Pd, or combinations thereof. The patterned electrical insulating layer may or may not remain over the base portion 382 after the mesas 384 are formed. If the patterned electrical insulating layer is removed, it can be removed using a conventional technique. Note that if the materials used for the base portion 382 and the plated electrically conductive material are different, islands, as opposed to mesas 384, are formed.

In another embodiment, the top portion of heat sink 38 may be patterned before it is attached to the electronic device. The top portion may include the mesas 384 and at least part of the base portion 382 (other part(s) of the base portion may include the second electrically conductive member layer and optional middle portion, if present). The pattern may be formed by machining, cutting, or etching the pattern. Alternatively, the top portion may be formed using a mold having the complementary pattern of the outer surface 388. When the top portion of the heat sink 38 is formed separate from the organic electronic device (e.g., not deposited or plated) and attached to the organic electronic device, the thickness may be greater than 25 microns so that it will be less likely to tear during routine handling.

Regardless of the pattern or the method of its formation, the top portion has additional exposed surface area to help increase heat dissipation from the device. Such a configuration is more advantageous for AM displays and lighting panels that may have higher power density requirements compared to a passive matrix ("PM") displays, sensors and detectors, voltaic cells, etc. Still, these other organic electronic devices can benefit from improved heat dissipation.

When the top portion of the heat sink 38 is formed separate from the organic electronic device, any combination of the electrically conductive layer, optional middle portion, and top portion of the heat sink 38 may be attached to the underlying layers. Attaching of the layer and portion(s) may be performed by thermocompression, soldering, laser heating or other local heating method. If the top portion of the heat sink 38 is patterned before attaching, some care during the attaching process may be exercised to reduce the likelihood of unacceptable levels of pattern distortion if heat is used during attachment. Some pattern distortion is acceptable. The attaching procedure helps to form a hermetic seal to substantially prevent oxygen or water from entering and degrading the performance of the devices within the array.

In an alternative embodiment, the pattern may be formed after the attaching process. In this embodiment, greater flexibility may be possible. The top portion of the integrated electrode/heat sink 38 may be formed by one or more of any number of different techniques including spin coating, casting, printing (ink jet printing, screen printing, etc.), vapor depositing, other deposition process, or any combination thereof. After deposition, the pattern may be formed by a conventional lithographic process (mask and etch) or using an electron beam, ion beam, laser or water cutting tool. Openings are cut through part of the thickness of the top portion to form the mesas 384 overlying the base portion 382.

Note than many other options for fabricating or attaching heat sink 38 or portions of it can be used. To list every potential fabrication procedure for heat sink 38 is nearly impossible. The flexibility in the fabrication of the organic electronic device 38 is an advantage.

FIG. 4 includes an illustration of another configuration that may be used. In FIG. 4, the second electrically conductive member 42 is separated from the heat sink 48 by an intermediate layer 44, such as a bonding layer. The second electrically conductive member 42 may include material(s) and be formed using a processing similar to a conventional common cathode in AM-driven OLEDs. After forming the second electrically conductive member 42 to a thickness no greater than approximately 1 micron, the intermediate layer 44 may be applied onto the second electrically conductive member 42. The heat sink 48 may then be attached to the intermediate layer 44. Alternatively, the intermediate layer 44 may be applied to the heat sink 48, and the combination of the intermediate layer 44 and heat sink 48 may be attached to the second electrically conductive member 42. In one embodiment, the heat sink 48 may lie within 90 microns of the organic active layer within organic layer 364.

The intermediate layer 44 may be an electrical conductor or insulator. The selection of electrical properties of the intermediate layer 44 can depend on the electrical configuration and design of the organic electronic device. After reading this specification, skilled artisans will be capable of determining the electrical properties of the intermediate layer 44 to be consistent with the electrical design.

In one embodiment, the first conductive members 362 may act as cathodes and the second electrically conductive member 42 may act as an anode. The materials used for the first and second electrically conductive members 362 and 42 as previously described may need to also be switched. In still another embodiment, the first electrically conductive members 362 may be replaced by a single first electrically conductive member, and the second conductive member 42 may be replaced by a plurality of second electrically conductive members. Pixel driver circuits would be connected to the second electrically conductive members instead of the first electrically conductive members.

In still another embodiment, the intermediate layer 44 may have z-axis conductors as previously described.

The heat sink 48 may be formed using any of the processes described with respect to heat sink 38. Heat sink 48 may be in the form of islands instead of the base portion 482 and mesas 484 as shown in FIG. 4. A single stencil mask similar to the one corresponding to the shapes of the mesas can be used. For the etching process, the etch can be continued through the entire thickness of the thick layer to form islands instead of mesas 484. In this embodiment with spaced-apart islands, endpoint detection (signal from the intermediate layer 44, when reached) for a dry etching process can be used rather than solely a timed etched to allow the process to be more repeatable in manufacturing.

FIG. 5 includes an illustration of a cross-sectional view of an organic electronic device similar to the one shown in FIG. 3. Unlike heat sink 38, heat sink 58 in FIG. 5 has a roughened surface. The pattern along outer side 588 may be achieved by using a mold. The mold has the complementary pattern and may be roughened by sandblasting or bead blasting or other abrading method. Alternatively, the pattern can be achieved by the sandblasting or bead blasting or other abrading the heat sink separate from using a mold. The dimensions of the features of the roughened surface along the outer side 588 have been previously described.

The roughened outer side 588 may be formed before the portion of the heat sink 58 with the outer side 588 is attached to the organic electronic device. Otherwise, its formation and options for formation are similar to those described with respect to heat sink 38 in FIG. 3.

FIG. 6 includes an integrated electrode/heat sink 68 having a black surface 688. The integrated electrode/heat sink 68 may be formed in a manner similar to heat sink 38. The black surface 688 may be formed along the outside surface. The black surface 688 may be obtained by painting the outer side with black paint that includes carbon black. The black surface 688 may be formed before or after the top portion of the heat sink 68 is in place over the substrate 30. A black surface when used with the organic electronic devices in FIGS. 1 and 2 also have better heat dissipation (compared to no black layer).

Note that various aspects of physical features and formation techniques for heat sinks 38, 48, 58, and 68 can be combined. For example, heat sinks 58 and 68 can have a bonding layer similar to the organic electronic device in FIG. 4. The heat sink 68 may have a patterned surface along the outer side. Any of heat sinks 38, 48, and 58 may have a black surface similar to the organic electronic device in FIG. 6. After reading this specification, skilled artisans will appreciate that many options exist regarding the structure and formation of the heat sinks.

Note that when the heat sink is attached to the organic electronic device, it may be attached at a wide variety of location. The heat sink can be attached to an array, outside the array, or nearly any other location.

6. Operating Finished Organic Electronic Devices

In this section, reference will be made to the structures in FIG. 3. The structures in FIGS. 5 and 6 may be used in a similar fashion. In FIG. 4, the heat sink 48 may be kept near ground potential, and the second electrically conductive member 42 may be biased to the potentials described with respect to heat sink 38.

During operation of a display or lighting panel, appropriate potentials are placed on the first electrically conductive members 362 and integrated electrode/heat sink 38 to cause radiation to be emitted from the organic active layer within organic layer 364. More specifically, when radiation is to be emitted, signals applied to electrically conductive members 362 and integrated electrode/heat sink 38, so that the difference in potential between the first electrically conductive members 362 and integrated electrode/heat sink 38 sufficiently forward biases the radiation-emitting component(s) and allow electron-hole pairs to combine within the organic active layer within organic layer 364, so that light or other radiation may be emitted from the organic electronic device. In a display, rows and columns can be given signals to activate the appropriate pixels (electronic devices) to render a display to a viewer in a human-understandable form.

If the organic electronic device includes radiation sensors within the array, radiation-sensing components may be reversed biased at a predetermined potential (e.g., integrated electrode/heat sink 38 has a potential approximately 5-15 volts higher than the first electrical conductive members 362). If radiation at the targeted wavelength or spectrum of wavelengths is received by the organic active layer within organic layer 364, the number of carriers (i.e., electron-hole pairs) within the organic active layer increases and causes an increase in current as sensed by sense amplifiers (not shown) within the peripheral circuitry outside the array.

In a voltaic cell, such as a photovoltaic cell, light or other radiation can be converted by the organic active layer of organic layer 364 to energy that can flow without an external energy source. The first electrically conductive members 362 and integrated electrode/heat sink 38 may be connected to a battery (to be charged) or an electrical load. After reading this specification, skilled artisans are capable of designing the electronic devices, peripheral circuitry, and potentially remote circuitry to best suit their particular needs.

7. Advantages

Embodiments described herein have benefits compared to conventional devices. Patterns can be used to increase surface area of the heat sinks 38, 48, and 58 along the outer sides 388, 488, and 588, respectively. FIG. 7 includes a plan view of an AM-driven array that illustrates some of the features. From a plan view, each of the heat sinks 38, 48, and 58 overlies and, from a plan view, occupy substantially the same area as the pixel array area 72. The surface area of each of the inner sides 386, 486, and 586 is approximately the same as each of the footprint of its corresponding heat sink, the pixel array area 72, or both. By having the heat sinks 38, 48, and 58 with patterned outer sides 388, 488, and 588, the outer surface area of any of the heat sinks 38 48, and 58 is significantly larger than the pixel array area 72. The larger surface area dissipates or otherwise transfers the heat better than a conventional device and increases the brightness and life of the organic electronic devices within the array.

The black surface 688 for the heat sink 68 in FIG. 6 can help to improve thermal radiation. When compared to substantially the same structure without a black surface, the black surface 688 can improve heat dissipation by approximately 5-10%. Because the organic layer 364 is sensitive to small changes in temperature, such an improvement can provide a significant benefit. After reading this specification, skilled artisans will appreciate that a black surface can be used on nearly any electronic device.

The use of the heat sinks may be most beneficial for full color, AM-driven displays that are designed to be used outdoors and lighting panels. The outdoor displays typically are larger than displays designed for indoor use and may have requirements for high emission intensity (at least approximately 500 cd/m$^2$) to compensate for high levels of ambient light (i.e., sunlight). Lighting panels may require intensities in a range of approximately 2000-5000 cd/m$^2$. Such applications can cause the pixel array to reach temperatures that are too high for the organic layer(s) within the pixel array. By using a heat sink (whether integrated with an electrode or separate from the electrode), heat may be effectively dissipated or otherwise transferred away from the organic layer(s) to cause only a modest increase in temperature (less than approximately 5° C. in many situations).

While large active matrix displays may benefit from better thermal dissipation compare to other organic electronic devices, any organic electronic device should have better reliability and last longer if the organic layer(s) remains cooler. Therefore, use of the heat sinks, black surfaces, or both can be beneficial for all organic electronic devices.

EXAMPLES

Control examples are presented to provide a basis of comparison. The other examples demonstrate embodiments that may be used. Some of the thicknesses given below represent nominal thicknesses and actual thicknesses substantially correspond to those nominal thicknesses.

Control Example 1

Conventional Device 1

Control Example 1 demonstrates that a PLED made with a conventional structure and package has a thermal resistance coefficient of approximately 150-200° C.·cm²/W. At an efficiency of approximately 1.2 cd/A, the corresponding temperature rise is approximately 12° C. at 200 cd/m² (4 V, 67 mW/cm²).

Control Example 1 includes a conventional device as illustrated in FIG. 1 and has a relatively thin second electrically conductive member layer and an EL efficiency of 1.2 cd/A. The organic electronic device includes a glass substrate having a thickness of approximately 0.6 mm, driver circuits 12, planarized dielectric layer 14, and transparent ITO electrodes 162 (approximately 100 nm thick). The active area is defined by the ITO electrodes and is approximately 1.5 cm×2 cm or approximately 3 cm². An organic layer 164 comprises a hole-transport layer and an EL polymer. A conductive polymer layer of PEDOT (Batron-p, electronic grade from Bayer A.G. can be used for all examples below as a hole-transport layer) approximately 200 nm thick is coated over ITO electrodes. An EL polymer is then over coated with a thickness of approximately 80 nm. A second electrically conductive member 166 of Ba(3 nm)/Al(400 nm) is thermally evaporated. The organic electronic device is then encapsulated with epoxy 182 and a glass sheet 184 without an air-gap. This PLED emits yellow light at forward bias higher than approximately 2.2 volts, reaching 200 cd/m² at approximately 4V.

Figure 8:
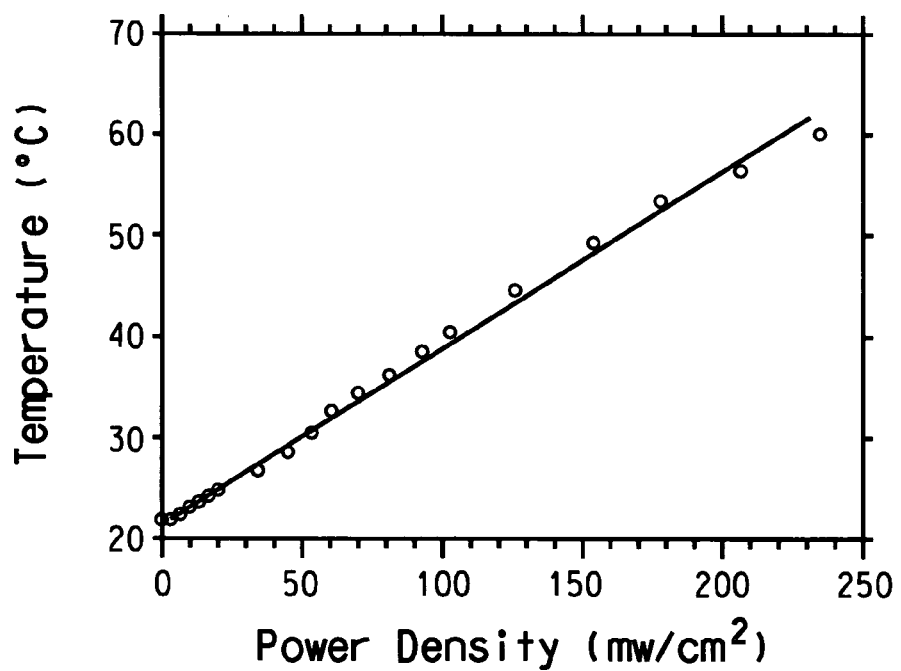
FIGS. 8 and 9 are plots of power versus temperature for the organic electronic devices of FIGS. 1 and 2, respectively.

FIG. 8 includes a plot of device temperature as a function of operation power density. The temperature is measured with an IR temperature probe in front of the PLED (light emission side). By fitting the data with a linear equation, the thermal resistance coefficient of the PLED is approximately 173° C.·cm²/W.

PLEDs can also made with cathode thickness varying from 100 nm to 400 nm. They are packaged in the same encapsulation scheme. Similar thermal resistance coefficients (in range of 150-200° C.·cm²/W) may be observed.

Control Example 2

Conventional Device 2

Control Example 2 demonstrates that a passive matrix PLED made with a conventional structure and package has a thermal resistance of approximately 200° C.·cm²/W. At an efficiency of approximately 1.5 cd/A, the corresponding temperature rise is about 11° C. at 200 cd/m² (4V, 53 mW/cm²).

Figure 2:
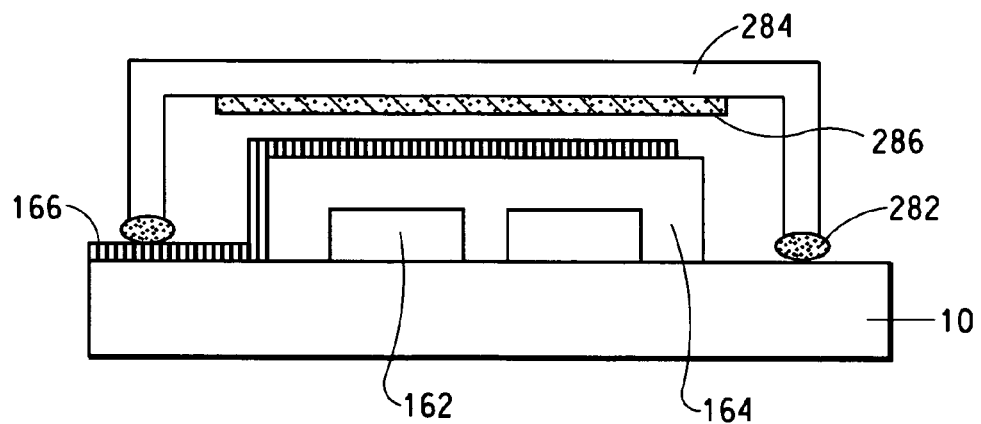
FIG. 2 is a cross-sectional view of an organic electronic device that is encapsulated by a metal cap. (Prior art)

A passive matrix PLED device is illustrated in FIG. 2. The PLED device in FIG. 2 has an EL efficiency of approximately 1.5 cd/A. The first electrodes 162 including ITO (approximately 100 nm thick and 300 m wide) are first patterned onto a glass substrate 10 approximately 0.6 mm thick. The organic layer 164 comprises a conductive polymer layer and an EL polymer. The conductive polymer layer of approximately 200 nm (PEDOT, Batron-p electronic grade) is coated over ITO. The EL polymer is then over coated with thickness of approximately 80 nm. Ba(3 nm)/Al(400 nm) is thermally evaporated using a stencil mask to form the second electrode 166. The device is then encapsulated using a metal cap 284 with desiccant 286 inside the air-gap between the metal cap 284 and the second electrode 166. The metal cap 284 is attached using an adhesive 282.

Figure 9:
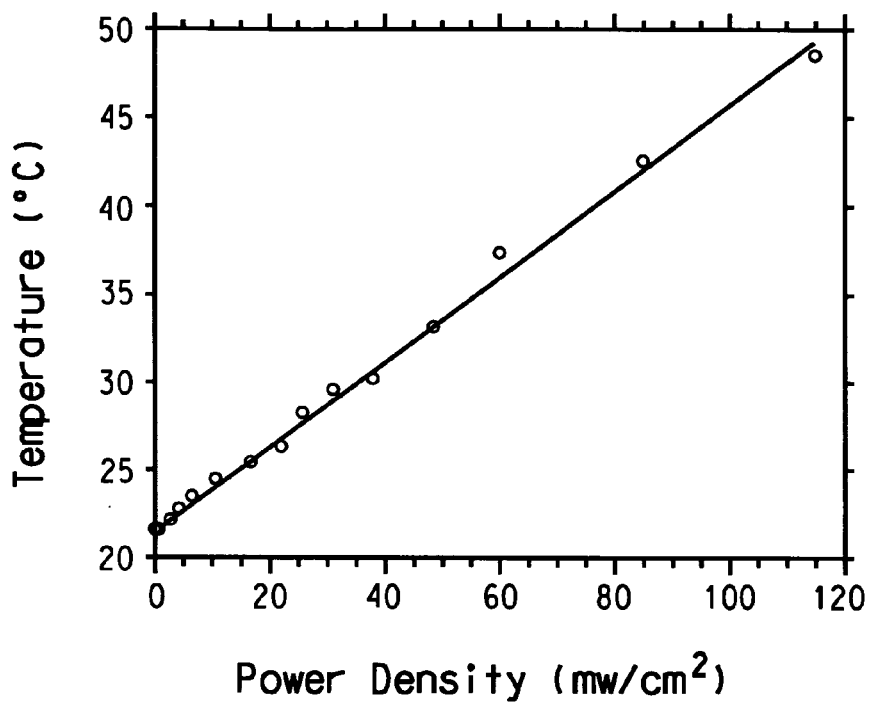

The resolution of the passive matrix PLED device is 96×64 in an area of approximately 6 cm². FIG. 9 includes a plot of the thermo-electronic property of the device. By fitting the data with a linear equation, the thermal resistance coefficient of the PLED is approximately 213° C.·cm²/W.

Example 1

Example 1 demonstrates that by painting an exposed surface black, the heat dissipation is enhanced by radiational cooling. Therefore, both the thermal resistance coefficient and the temperature rise are reduced.

Figure 10:
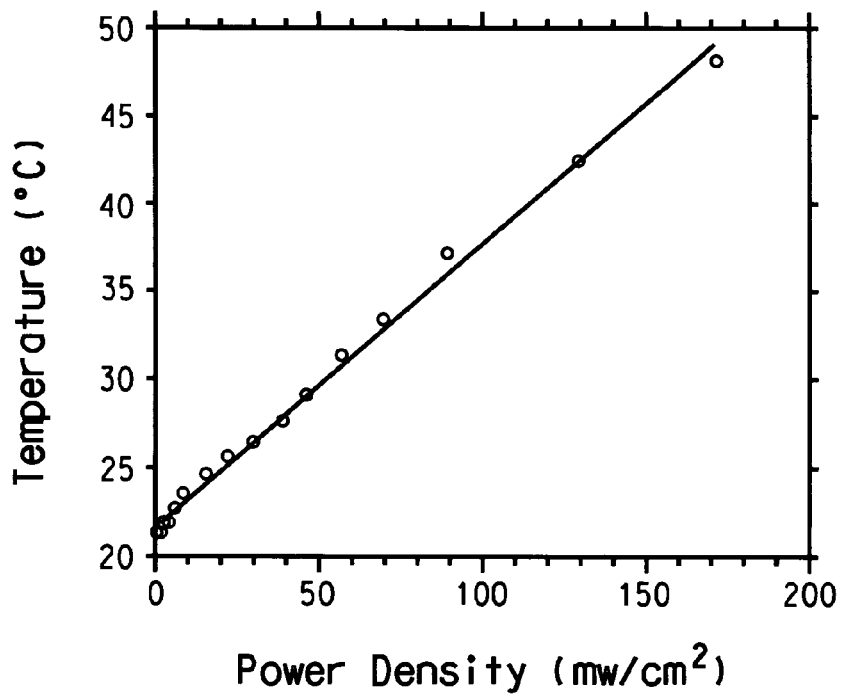
FIG. 10 is a plot of power versus temperature for the organic electronic devices described with respect to Example 1.

The same device from Control Example 1 can used for this example. The epoxy/glass side of the said device is painted to black by using a commercially available spraying paint. FIG. 10 includes a plot of the temperature of the device as a function of operation power. By fitting the data with a linear equation, a thermal resistance coefficient of the device is approximately 158° C.·cm²/W, which is about 5-10% lower than that obtained without black paint.

The experiment can be repeated with different black paints including those comprising carbon black powders or graphic fibers. The thermal resistance is reduced. The coefficient varies among different paint materials, and for a given material, varies with the topology of the painted surface.

Example 2

Example 2 demonstrates that an organic electronic device having a heat sink with a patterned surface has low thermal resistance. With such a structure, the temperature rise of the PLED device at operation power can be reduced to less than 5° C.

A device similar to Control Example 1 except that the second electrode is replaced by Ba(4 nm)/Al(400 nm)/Ag (400 nm)/ln alloy (10 μm). Ba/Al/Ag are deposited by thermal evaporation. A thin foil of an In alloy is then placed on top of the cathode, and the device is then placed in an $N_2$ dry box at approximately 130° C. for approximately 30 seconds. The ln alloy is melted over the Ag layer during the heating process. The device was then cooled to room temperature naturally. This device is further encapsulated with epoxy/glass sheet with the same procedure as that shown in Control Example 1. An aluminum metal sheet with a patterned surface is attached to the epoxy/glass layer with a thermal conductive paste (made with organic silicone which is electrically insulating). With an efficiency of approximately 1.2 cd/A, the temperature rise of the device is approximately 1° C. while operating at approximately 200 cd/m² (4V, 67 mW/cm²), corresponding to a thermal resistance coefficient of approximately 105° C.·cm²/W.

PLED devices can also fabricated without the epoxy/glass layer (the same patterned metal sheet mediated with thermal conductive paste). A similar temperature rise can be observed. The patterned metal sheet can be replaced with several commercial heat sinks designed for IC chips with black coating and different fin structures. Similar effects are observed with temperature rise was less than 5° C.

Example 3

A PLED device was made with EL efficiency of 1.2 cd/A. It was made on a glass substrate of 0.6 mm think with transparent ITO electrode (~100 nm thick). The active area was 1.5 cm×2 cm=3 cm². A conductive polymer layer of ~200 nm (PEDOT, purchased from Bayer, Batron-p electronic grade) was coated over ITO. The EL polymer was then over coated with thickness of ~80 nm. Ba(3 nm)/Al(400 nm) was thermally evaporated as the top electrode. The device was then encapsulated with epoxy/glass sheet without an air-gap (similar to that shown in FIG. 1). This PLED emits yellow light at forward bias higher than 2.2 volt, reaching 200 cd/m$^2$ at ~4V. An aluminum metal sheet with rough surface was attached to the epoxy/glass layer with a thermal conductive paste (made with organic silicone which is electrically insulating).

Thermal-electric properties of this PLED were studied. Thermal resistance of 106° C.·cm$^2$/W was obtained.

The roughened outer surface was then blacked. The experiment was then repeated. Further reduction of thermal resistance was observed.

This example demonstrated that the application of an aluminum plate with rough surface on the PLED made with structure and package disclosed in pre-arts lowered the thermal resistance by 40% or beyond. For a PLED with efficiency ~1.2 cd/A, the corresponding temperature rise was ~7° C. or less at 200 cd/m$^2$ (4V, 67 mW/cm$^2$).

Example 4

Example 4 demonstrates that an active matrix display with packaging structures disclosed herein can be operated stably to the level >12,000 cd/m$^2$. An organic electric device with such a display can be used to achieve a stable display intensity (i.e., operation intensity) over 10,000 cd/m$^2$.

The devices similar to that as described in Example 2 can be used. The EL efficiency is approximately 12 cd/A. Operating under direct current condition at 100 mA/cm$^2$, the device temperature rise can be less than 10° C. and remain stable. The emission light intensity is approximately 12,000 cd/m$^2$. Integrating such devices into a full-color active matrix display with aperture ratio of 50% (sub-pixel), these data imply a stable operation light intensity of greater than 1,600 cd/m$^2$. Such devices can be used for video (motion picture) applications under sunlight conditions. Since the average power (as well as display intensity) is approximately 30% of the peak power (display intensity). Thus, the display can be stably operated at greater than 4,800 cd/m$^2$. Such results are substantially the same whether the organic active layer includes a polymer or small molecules.

Example 5

Example 5 demonstrates that an organic electronic device having an active matrix display having a packaging structure with a rough surface has low temperature rise (less than 5° C.) at operating luminance.

An active matrix OLED display can be made with device structure described in FIG. 4 except as noted. The substrate includes glass (Corning product #1737) with 100 mm×100 mm (4 inch×4 inch) nominal size. The display area is approximately 81 mm×61 mm located at the center of the substrate. The display contains 320×240 color pixels with pixel pitch size of 255 μm. The top of the package layer includes an aluminum sheet with a rough surface.

The sheet may be attached to the cathode with a thermal conductive paste made of silicone. The surface temperature rise can be measured (in front of user side of the display) and is a function of input electric power. The temperature rise is less than 5° C. at device operation luminance. This display can be operated to greater than 500 cd/m$^2$ (limited by the pixel driver design) stably.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An organic electronic device comprising:
an organic active layer; and
a heat sink having a side with a roughened surface, wherein the heat sink lies within 1500 nanometers of the organic active layer of the organic electronic device, wherein the ratio of area:thickness for the heat sink is at least 500:1, when the area and thickness are expressed in units of mm$^2$ and mm, respectively, and the heat sink consists of at least a first metal having a melting point between 85° and 240° C.

2. The organic electronic device of claim 1, wherein the heat sink is attached to an array within the organic electronic device.

3. The organic electronic device of claim 1, wherein the heat sink has a thickness no greater than 500 microns.

4. The organic electronic device for claim 1, wherein the organic electronic device is designed to be at least one of an outdoor display and a lighting panel.

5. The organic electronic device of claim 1, wherein the side with the roughened surface has a black surface.

6. The organic electronic device of claim 1, wherein the first metal is selected from the group consisting of In and Sn.

7. An organic electronic device comprising:
an organic active layer;
an array of organic electronic components; and
a heat sink attached to the array, wherein:
the heat sink lies within 1500 nanometers of the organic active layer;
wherein the organic electronic device is designed to operate at a power density of at least 50 mW/cm$^2$, and the heat sink consists of at least a first metal having a melting point between 85° and 240° C.

8. The organic electronic device of claim 7, wherein the heat sink has a black surface.

9. The organic electronic device of claim 8, wherein the heat sink has a pattern on a side opposite a substrate, wherein the pattern extends at least partially through a thickness of the heat sink.

10. The organic electronic device of claim 8, wherein the heat sink comprises islands.

11. The organic electronic device of claim 8, wherein the heat sink comprises a base portion and mesas extending from the base portion.

12. The organic electronic device of claim 7, wherein the first metal is selected from the group consisting of In and Sn.

13. An organic electronic device comprising:
an organic active layer;
an array of organic electronic components, wherein the organic electronic device is designed to operate at a power density of at least 50 mW/cm$^2$; and a heat sink attached to the array, wherein the heat sink lies within 1500 nanometers of the organic active layer, and the ratio of area:thickness for the heat sink is at least 500:1 when the area and thickness are expressed in units of mm$^2$ and mm, respectively, and the heat sink consists of at least a first metal having a melting point between 85° and 240° C.

14. The organic electronic device of claim 13, wherein the organic electronic device is designed to be at least one of an outdoor display and a lighting panel.

15. The organic electronic device of claim 13, wherein the first metal is selected from the group consisting of In and Sn.

* * * * *